US 9,531,405 B2

(12) United States Patent
Kanievskyi et al.

(10) Patent No.: US 9,531,405 B2
(45) Date of Patent: Dec. 27, 2016

(54) METHOD AND SYSTEM FOR ESTIMATING PARAMETER OF DATA CHANNEL MODEL IN COMMUNICATION SYSTEM

(71) Applicant: Samsung Electronics Co., Ltd., Suwon-si, Gyeonggi-do (KR)

(72) Inventors: Oleksandr Kanievskyi, Kiev (UA); Mykola Raievskyi, Cherkassy (UA); Oleg Kopysov, Kharkov (UA); Roman Hush, Okhtyrka (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 42 days.

(21) Appl. No.: 14/593,417

(22) Filed: Jan. 9, 2015

(65) Prior Publication Data
US 2015/0200684 A1 Jul. 16, 2015

(30) Foreign Application Priority Data
Jan. 13, 2014 (KR) ........................ 10-2014-0003730

(51) Int. Cl.
*H03M 13/01* (2006.01)
*H03M 13/03* (2006.01)
(Continued)

(52) U.S. Cl.
CPC ............ *H03M 13/015* (2013.01); *G06F 11/10* (2013.01); *H03M 13/03* (2013.01); *H03M 13/47* (2013.01);
(Continued)

(58) Field of Classification Search
CPC .. H04L 41/145; H04L 1/0009; H04L 25/0202; H04L 1/0056; H04L 41/142; H03M 13/015; H03M 13/02; H03M 13/47; G06F 11/10
(Continued)

(56) References Cited

U.S. PATENT DOCUMENTS 6,397,368 B1 * 5/2002 Yonge, III ............ H04L 1/0003
714/784
7,809,996 B2 * 10/2010 Cioffi ...................... H04B 3/32
714/704
(Continued)

FOREIGN PATENT DOCUMENTS

WO   2006/120521 A1   11/2006
WO   2010/041233 A1   4/2010

OTHER PUBLICATIONS

Samsung Electronics Co., Ltd., Proposed Source Blocking Algorithm and Simulation Results, 3GPP TSG-SA4#70, Aug. 13-17, 2012, S4-121087, Update of S4-120990, Agenda Item 9, 16.3.1, 3GPP, Sophia-Antipolis, France.

*Primary Examiner* — John J Tabone, Jr.
(74) *Attorney, Agent, or Firm* — Jefferson IP Law, LLP

(57) ABSTRACT

A method and a system for estimating a parameter in a communication system are provided. The method includes estimating a parameter of a data channel model in a communication system, decoding a packet received through a determined noise channel to convert the packet into data indicating one of a success and failure of a reception of the packet, configuring a prototype channel having at least one unknown parameter, estimating the at least one unknown parameter using the data indicating the one of the success and the failure of the reception of the packet, and determining the size of a parity field of a forward error correction (FEC) symbol, using the estimated at least one unknown parameter.

15 Claims, 6 Drawing Sheets

(51) Int. Cl.
*H03M 13/47* (2006.01)
*H04L 1/00* (2006.01)
*H04L 25/02* (2006.01)
*G06F 11/10* (2006.01)
*H04L 12/24* (2006.01)

(52) U.S. Cl.
CPC ........... *H04L 1/0009* (2013.01); *H04L 1/0056* (2013.01); *H04L 25/0202* (2013.01); *H04L 41/142* (2013.01); *H04L 41/145* (2013.01)

(58) Field of Classification Search
USPC .......................... 714/703, 712; 370/252, 241
See application file for complete search history.

(56) References Cited

U.S. PATENT DOCUMENTS

| | | | | |
|---|---|---|---|---|
| 2001/0055319 | A1* | 12/2001 | Quigley | H04L 1/203 370/480 |
| 2004/0153909 | A1* | 8/2004 | Lim | H04L 1/0009 714/714 |
| 2006/0268733 | A1* | 11/2006 | Rhee | H04L 41/082 370/252 |
| 2008/0175236 | A1* | 7/2008 | Lee | H04L 1/0045 370/389 |
| 2009/0037792 | A1* | 2/2009 | Choi | H04H 20/30 714/755 |
| 2011/0188561 | A1 | 8/2011 | Mizrahi et al. | |
| 2013/0246884 | A1* | 9/2013 | Lee | H04L 1/0009 714/755 |
| 2014/0192847 | A1* | 7/2014 | Afkhami | H04L 27/2649 375/219 |
| 2015/0222294 | A1* | 8/2015 | Eroz | H03M 13/373 714/776 |
| 2015/0222486 | A1* | 8/2015 | Cioffi | H04L 41/0823 370/486 |
| 2015/0334708 | A1* | 11/2015 | Lee | H04W 72/0446 370/329 |

* cited by examiner

METHOD AND SYSTEM FOR ESTIMATING PARAMETER OF DATA CHANNEL MODEL IN COMMUNICATION SYSTEM

CROSS-REFERENCE TO RELATED APPLICATION(S)

This application claims the benefit under 35 U.S.C. §119 (a) of a Korean patent application filed on Jan. 13, 2014 in the Korean Intellectual Property Office and assigned Serial number 10-2014-0003730, the entire disclosure of which is hereby incorporated by reference.

TECHNICAL FIELD

The present disclosure relates to a method and a system for estimating a parameter in a communication system. More particularly, the present disclosure relates to a method and a system for estimating a parameter of a data channel model in a communication system.

BACKGROUND

Generally, there is noise in a communication channel of a communication system. Owing to the noise in the communication channel, a method of correcting an error of data, which is transmitted owing to the noise, may be used, when data is transmitted from a transmitting side to a receiving side, and one of the methods of correcting the error of data may include a Forward Error Correction (FEC).

In the FEC method, data is processed, or specific added information that may be obtained from the data is generated as a parity field when the data is transmitted from the transmitting side to the receiving side, where the parity pa field rt is added to the data which is to be transmitted, and the data is transmitted. At this time, the data to be transmitted is partitioned into parts. The sizes of the partitioned parts are different according to the communication system. For example, a stream of data to be transmitted is partitioned into predetermined sizes of packages according to a Source Blocking Algorithm (SBA). The partitioned packages are encoded by a FEC encoder and are transmitted through a data channel.

The receiving side may receive the encoded packet, which is transmitted through the data channel. Since the received packet is transmitted through a noise channel, the received packet may be a corrupt packet by noise. Therefore, the receiving side may order the received packet by a Source Deblocking Algorithm (SDA) and restore original data using the parity field in the corrupt packet, which is transmitted through the noise channel. Through the processes mentioned above, the received packet may be determined as a reception success or a packet loss.

The above information is presented as background information only to assist with an understanding of the present disclosure. No determination has been made, and no assertion is made, as to whether any of the above might be applicable as prior art with regard to the present disclosure.

SUMMARY

Using a real data channel for testing new forward error correction (FEC) encoder/decoder may cause inconvenience. For example, when the testing is applied to a real system, a time when a use of a data channel is less should be checked to use the real system I, a time or a special and separate channel should be allocated. In addition, since an experiment or a test should be performed in various environments, it is very difficult to perform the experiment or the test in correspondence to a case according to these conditions.

Aspects of the present disclosure are to address at least the above-mentioned problems and/or disadvantages and to provide at least the advantages described below. Accordingly, an aspect of the present disclosure is to provide a simulation method in order to test new encoder/decoder.

A data channel form used in a simulation may be a form close to a data channel having real noise. When a model of a channel is assumed using such a form, it is possible to simulate in a form similar to a real data channel.

When a new encoder/decoder is designed, the size of a parity field is determined according to the noise level of a data channel. When there is more noise, the parity field should become larger. When there is less noise, the parity field may become smaller. Thus, in order to accurately define the size of the parity field, simulation data should be close to that of a real data channel as much as possible.

Another aspect of the present disclosure is to provide a method and a system for accurately estimating a parameter of a data channel model in a predetermined communication system.

Another aspect of the present disclosure is to provide a method and a system for estimating a parameter, which are capable of improving efficiency and increasing a speed of FEC encoder/decoder.

Another aspect of the present disclosure is to provide a method and a system for estimating parameters of a data channel in a static situation.

Another aspect of the present disclosure is to provide a method and a system for estimating parameters of a data channel in a dynamic situation.

In accordance with an aspect of the present disclosure, a method of estimating a parameter of a data channel model in a communication system is provided. The method includes decoding a packet received through a determined noise channel to convert the packet into data indicating one of a success and a failure of a reception of the packet, configuring a prototype channel having at least one unknown parameter, estimating the at least one unknown parameter using the data indicating the one of the success and the failure of the reception of the packet, and determining a size of a parity field of a FEC symbol, using the estimated at least one unknown parameter.

In accordance with another aspect of the present disclosure, a system for estimating a parameter of a data channel model in a communication system is provided. The system includes a transmitting electronic device configured to construct a packet in a predetermined error correction encoding scheme and transmits the packet, and a receiving electronic device configured to decode the packet received from the transmitting electronic device through a predetermined noise channel to convert the packet into data indicating one of a success and a failure of the reception of the packet, to configure a prototype channel having at least one unknown parameter, to estimate the at least one unknown parameter using the data indicating the one of the success and the failure of the reception of the packet, and determines a size of a parity field of a FEC symbol using the estimated at least one unknown parameter.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein may be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
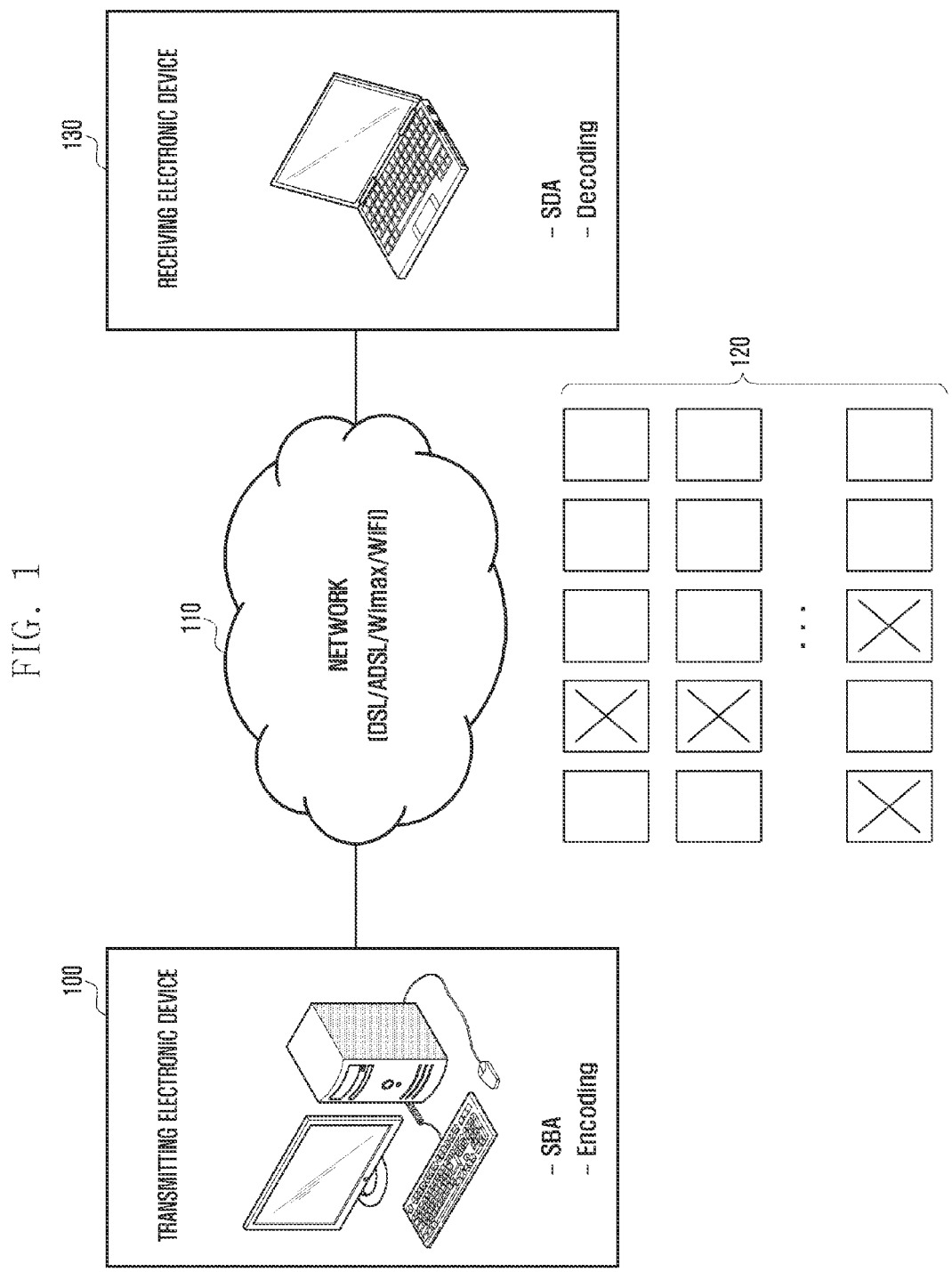
FIG. 1 is a conceptual construction diagram of a communication system which performs a simulation for estimating a parameter of a data channel according to an embodiment of the present disclosure.

FIG. 1 is a conceptual construction diagram of a communication system that performs a simulation for estimating a parameter of a data channel according to an embodiment of the present disclosure.

Referring to FIG. 1, a communication system using a Forward Error Correction (FEC) scheme includes a transmitting electronic device 100, a receiving electronic device 130 and a network 110. The transmitting electronic device 100 may partition data which is to be transmitted into parts having predetermined sizes based on a Source Blocking Algorithm (SBA) when the transmitting electronic device 100 may transmit the data, as described above. The transmitting electronic device 100 may encode the data according to the configured FEC scheme. Encoding the data according to the FEC scheme may include processing the data or generating specific added information, which may be obtained from the data as a parity field and adding the parity field to the data to be transmitted, as described above.

The encoded data is transmitted through the network 110 to the receiving electronic device 130. At this time, the network 110 may be various networks such as a Digital Subscriber Line (DSL), an Asymmetric Digital Subscriber Line (ADSL), a World interoperability for Microwave Access (WiMax) and a Wireless Fidelity (WiFi). In addition, as described above, noise may be basically included in each channel of the network 110. The level of the noise may change according to characteristics of the network, a construction form of the network, an arrangement of the network, a number of communication channels adjacent to the network, a number of channels which are simultaneously connected for a communication, and the like. The size of the parity field is changed according to the change of the noise level. For example, when the noise level is high, the size of the parity field should become larger in order to smoothly transmit data. In contrast, when the noise level is low, that is, the noise is small, the size of the parity field may become smaller in order to smoothly transmit data.

The receiving electronic device 130 may receive the data transmitted through the network 110. The receiving electronic device 130 may order a received packet by a Source Deblocking Algorithm (SDA), as described above. The packet received by the receiving electronic device 130 may be a corrupt packet owing to the noise in the network 110. Thus, the receiving electronic device 130 may restore original data using the parity field in the corrupt packet. At this time, the original data of the packet may be restored using the parity field, and the restoration to the original data of the packet may be impossible. This is shown as a reference numeral 120 of FIG. 1. Referring to the reference numeral 120, a packet of which corruption is deepened by the noise and thus a restoration is impossible, among packets transmitted through the network 110, is marked as "X".

The types of data transmitted by the FEC scheme as described above may include satellite navigation data, video data, voice streaming services, a video chatting, a voice call, data transmitted from a satellite, and the like. More various types of data may be transmitted according to a network using the FEC scheme, in addition to the above-mentioned data. Types of data are not limited in the present disclosure.

Two types of various embodiments will be largely described using a whole system construction described above. As a first embodiment, a method of estimating a parameter of a data channel in a static situation will be described. As a second embodiment, a method of estimating a parameter of a data channel in a dynamic situation will be described.

First Embodiment

A Method of Estimating a Parameter of a Data Channel in a Static Situation

First, a data channel described in the first embodiment may be a data channel used in a system such as a DSL, an ADSL, a WiFi and a WiMax. The same data channel may be applied to other systems. In addition, a data channel, which has somewhat changed and has a form similar to the above-mentioned data channel, in correspondence to a corresponding system may be applied to other systems. In addition, through the method of the first embodiment, a model for estimating a noise channel may be obtained and thus packet loss may be simulated. Therefore, when the method according to the first embodiment is used, a parameter may be set (or defined) more accurately in the FEC scheme. Through this, when the method according to the present disclosure is applied to a specific data channel, the speed of an FEC encoder may be improved.

Figure 2:
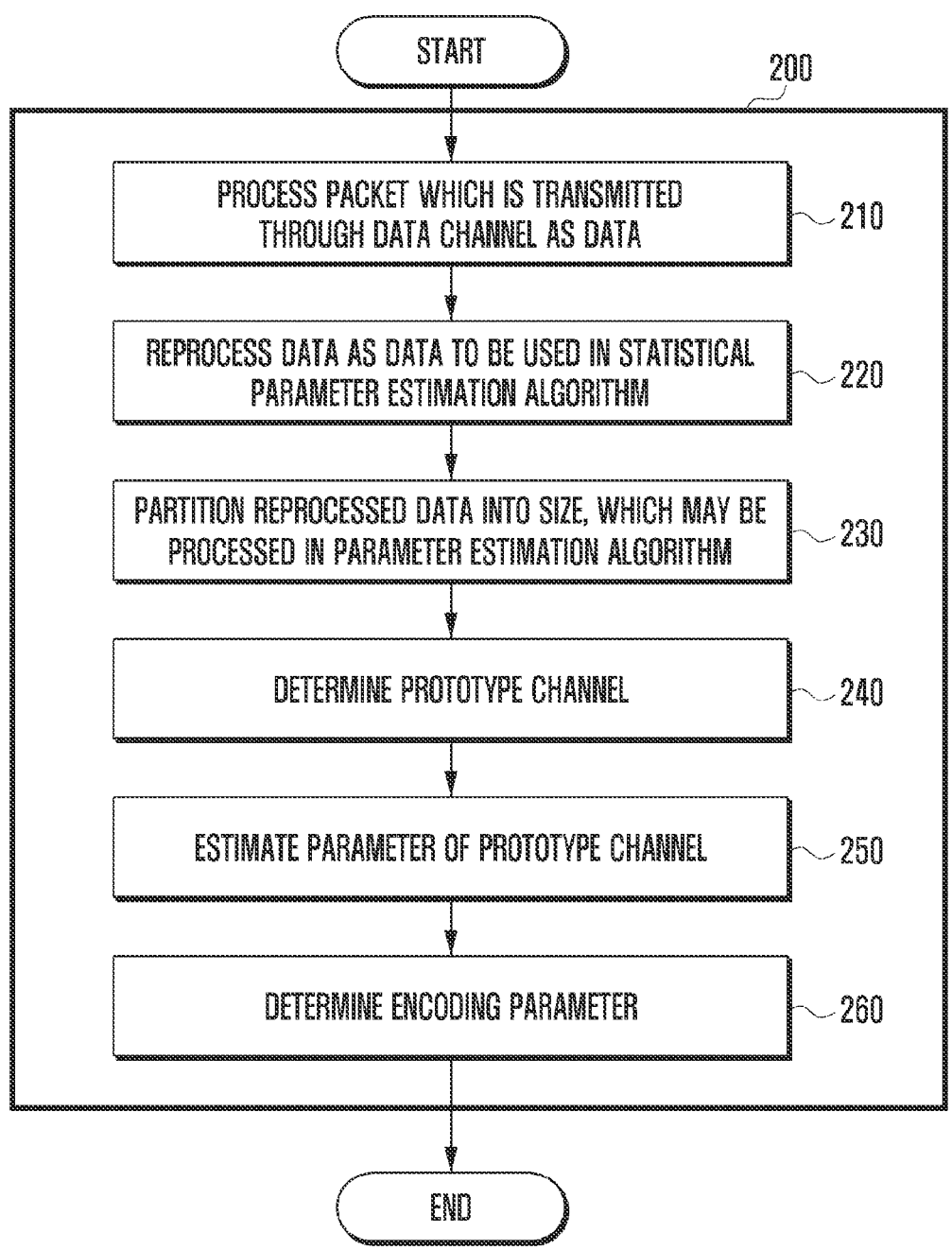
FIG. 2 is a flowchart illustrating a method of estimating a parameter of a data channel in a static situation according to an embodiment of the present disclosure.

FIG. 2 is a flowchart illustrating a method of estimating a parameter of a data channel in a static situation according to the first embodiment of the present disclosure.

Referring to FIG. 2, a method 200 of estimating a parameter of a data channel in a static situation is illustrated. In operation 210, in order to estimate a parameter of a data channel, a receiving electronic device 130 may process a packet transmitted through a data channel as data. The data channel may be a noise channel including noise as described above, and thus a portion or a whole of the transmitted packets may be corrupted by the noise. The corrupt packet (or a packet which may not be restored) may be basically regarded as a lost packet. Therefore, the transmitted packet becomes a successfully received packet (a case in which the packet is not caused by the noise or a case in which the correction of the packet is possible) or a lost packet (a case in which the packet is corrupted caused by the noise or a case in which the correction of the packet is impossible).

Therefore, in operation 220, the receiving electronic device 130 may reprocess the data that is processed in the above-mentioned operation 210 as data to be used in a statistical parameter estimation algorithm. The statistical parameter estimation algorithm will be described in more detail in operation 240. When the data is reprocessed as the data to be used in the statistical parameter estimation algorithm as described in the operation 220, according to an embodiment, statistical data may be expressed as '0' and '1'. For example, '0' may refer to a normally received packet, and '1' may refer to a lost packet. Alternatively, '0' may refer to the normally received packet, and '1' may refer to the lost packet.

After the receiving electronic device 130 may convert the data using the statistical parameter estimation algorithm using the results of the conversion from the packet into the data, in operation 230, the receiving electronic device 130 may partition the data that is converted to be used in a parameter estimation algorithm into predetermined units of several parts. This is for partitioning the data into a unit that is processed in the parameter estimation algorithm described later in operation 250. When the size of the unit that is processed in the parameter estimation algorithm is larger than the size of the data converted to be used in the parameter estimation algorithm, monolithic data may be output. A reason to perform the operation 230 is because the size of the data may be limited in processing the data in the parameter estimation algorithm. However, as described above, when the size of the data is not limited or the size of whole data is smaller than the limited size, operation 230 may not be necessary. Since the present disclosure describes a general case, it is assumed that the data converted to be used in the parameter estimation algorithm is partitioned.

An example in which the data converted to be used in the parameter estimation algorithm is partitioned will be described with reference to an accompanying drawing.

Figure 3:
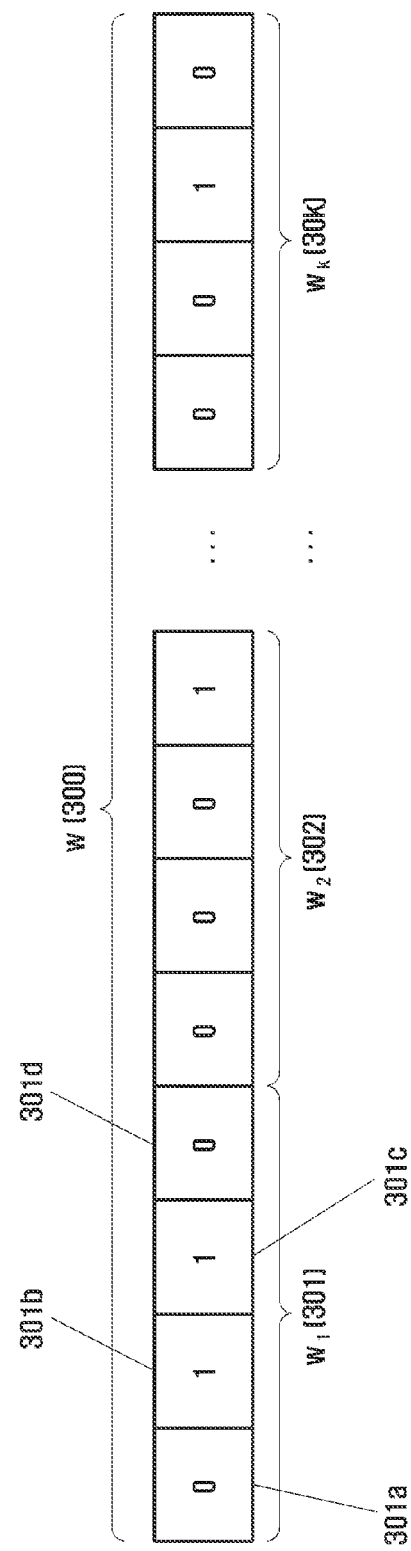
FIG. 3 is a view illustrating an example in which data converted to be used in a parameter estimation algorithm is partitioned according to an embodiment of the present disclosure.

FIG. 3 is a view illustrating the example in which the data converted to be used in the parameter estimation algorithm is partitioned according to an embodiment of the present disclosure.

Referring to FIG. 3, a stream of the data processed as '0' in a case of a successful reception and processed as '1' in a case of a loss, among the data converted to be used in the parameter estimation algorithm is shown. Referring to FIG. 3, 'W(300)' is whole data obtained from the packet, and successfully received data and lost data are mixed in the whole data. In addition, in the example of FIG. 3, the whole data W(300) includes k partitioned sub groups $W_1(301)$, $W_2(302)$, . . . , and Wk(30k). Each of the sub groups $W_1(301)$, $W_2(302)$, . . . , and Wk(30k) may be processed as an average value by the parameter estimation algorithm as occasion demands.

Referring to FIG. 3, for example, one group, such as a first group $W_1(301)$ may include four converted data 301a, 301b, 301c and 301d. Here, one group may be an amount (or the size) of data which may be processed by the parameter estimation algorithm. Therefore, the case shown in FIG. 3 is only an example, and it is obvious that the amount (or the size) of the converted data in the one group may be changed according to a maximum value which may be acceptable by the parameter estimation algorithm.

In operation 240, the receiving electronic device 130 may determine a prototype channel. Generally, there are many known models for simulating a loss of a packet in a communication system. A representative model includes a Bernoulli model, a Gilbert model, a Gilbert-Elliot model, and the like.

A model proposed in the present disclosure is similar to the Gilbert model except that the model proposed in the present disclosure does not allow burst losses in the received packet. A channel model proposed in the present disclosure will be described with reference to an accompanying drawing.

Figure 4:
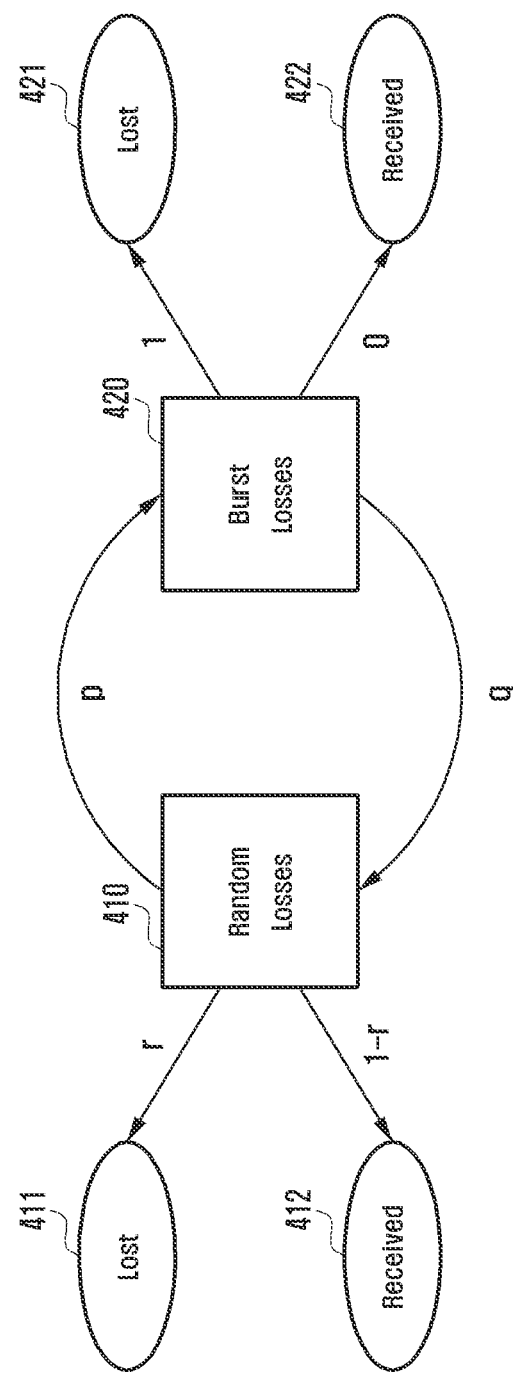
FIG. 4 is a view illustrating a data channel model in a hidden Markov model (HMM) proposed according to an embodiment of the present disclosure.

FIG. 4 is a view illustrating a data channel model in a hidden Markov model (HMM) proposed according to an embodiment of the present disclosure.

Referring to FIG. 4, losses are largely classified as a random losses state 410 and a burst losses state 420. In addition, a packet received in the random losses state 410 may be classified as a case of a lost state 411 and a case of a normally received state 412. In the same manner, a packet received in the burst losses state 420 may be classified as a case of a lost state 421 and a case of a normally received state 422.

The channel model proposed in the FIG. 4 may be defined as a form of a HMMs. When the channel model is defined as the form of the HMMs, a possibility of the lost state 411 of the packet received in the case of the random losses state 410 is "r", and a possibility of the normally received state 422 of the packet received in the case of the random losses state 410 is "1−r". In addition, when the channel model is defined as the channel model of FIG. 4, in the case of the burst losses state 420, most of the received packet becomes the lost state 421 and does not become the normally received state 422.

In addition, a transition probability from the random losses state 410 to the burst losses sate 420 is "p", and a transition probability from the burst losses state 420 to the random losses state 410 is "q".

Referring to FIG. 4, theoretical models may be applied to various types of noise channels, and in order to apply the theoretical model of FIG. 4 to the noise channel, parameters of "p", "q" and "r" should be estimated.

Therefore, in the burst losses state 420, serial losses of the packets should be simulated, and in the random losses state 410, discrete losses should be simulated. In the present disclosure, all models having at least one hidden state may be selected as a prototype of the channel model.

When any of the above-mentioned channel models of the prototype is selected, in operation 250, the receiving electronic device estimates the parameter of the channel model of the prototype selected in operation 240. Referring to FIG. 4, it may be the case in which the parameters of "p", "q" and "r" are estimated. However, in the present disclosure, the prototype channel model is not limited, and all types of channel models having at least one unknown parameter may be applied to the present disclosure.

A Maximum Likehood Estimation (MLE) scheme may be used as a method of estimating an unknown parameter according to an embodiment of the present disclosure. Since it is impossible to obtain accurately a likehood function based on an unknown MLE parameters, estimators may estimate parameters by an Expectation-Maximization (EM) algorithm. There is a Baum-Welch algorithm as a specific case of the EM algorithm.

Parameters of the prototype channel may be estimated using any of the EM algorithm, the Baum-Welch algorithm and an algorithm similar to these. A case in which any of these methods is used will be described with reference to FIG. 5.

Figure 5:
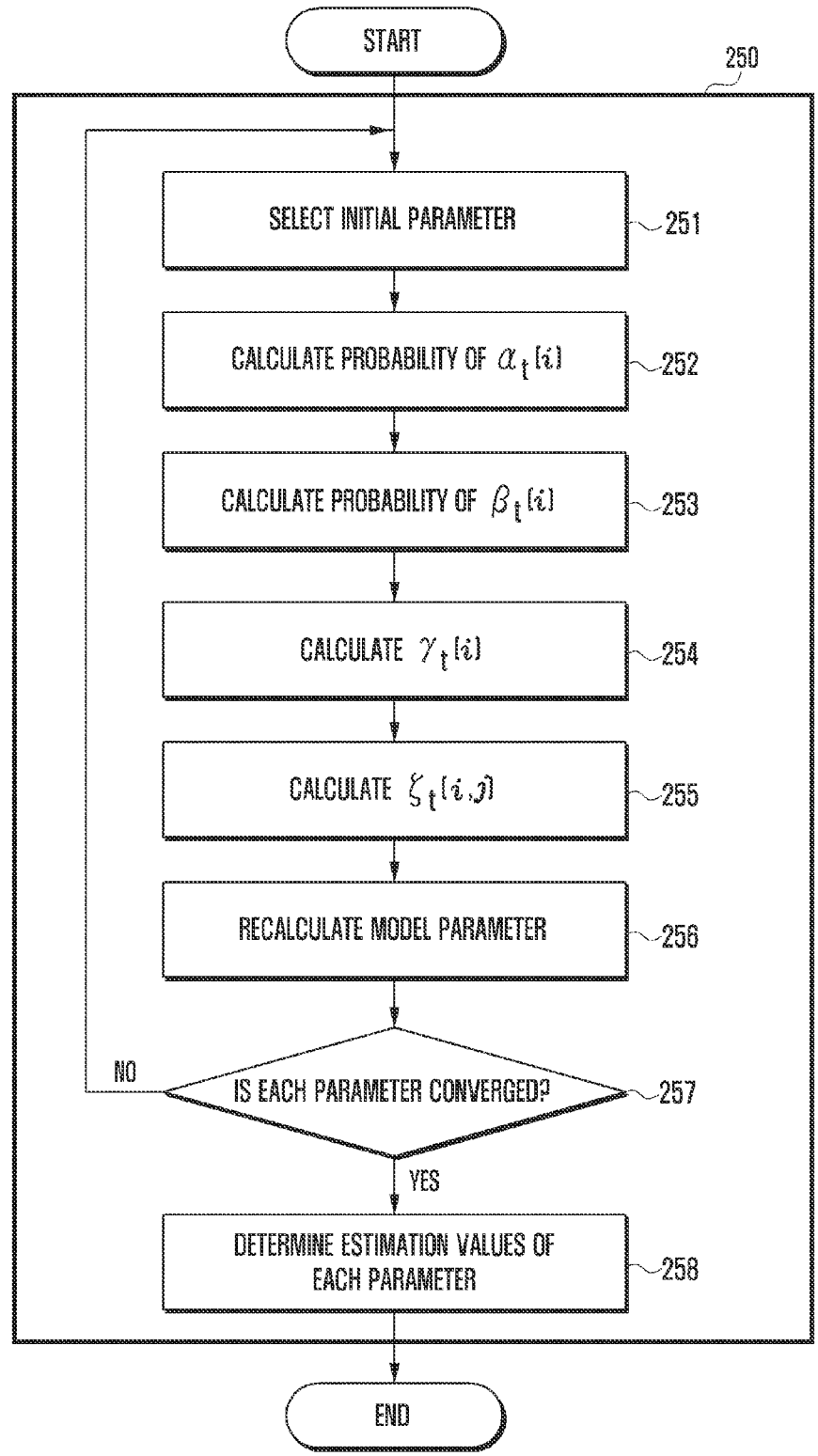
FIG. 5 is a flowchart illustrating a method of estimating parameters in a prototype channel model according to an embodiment of the present disclosure.

FIG. 5 is a flowchart illustrating a method of estimating parameters in a prototype channel model according to an embodiment of the present disclosure.

Referring to FIG. 5, operations in the case in which the parameters of the prototype channel are estimated using any of the EM algorithm, the Baum-Welch algorithm and an algorithm similar to these, as described above the operation 250 are illustrated.

First, in operation 251, the receiving electronic device 130 may select initial parameters by Equation 1 below.

$$\pi = (\pi_1, \pi_2),$$
$$A = \begin{pmatrix} a_{11} & a_{12} \\ a_{21} & a_{22} \end{pmatrix} = \begin{pmatrix} 1-p & p \\ q & 1-q \end{pmatrix},$$
$$B = \begin{pmatrix} b_{11} & b_{12} \\ b_{21} & b_{22} \end{pmatrix} = \begin{pmatrix} 1-r & r \\ 0 & 1 \end{pmatrix}.$$

Equation 1

In Equation 1, $\pi$ may be a stationary distribution value for a matrix A, may correspond to an initial distribution, and may be defined as a uniform distribution when the stationary distribution does not exist. In addition, the matrix A is a matrix using the transition probability from the random losses state 410 to the burst losses state 420 in an environment such as the HMM described above with reference to FIG. 4. A matrix B is a matrix using a reception success probability and a loss probability of the packet in the random losses state 410. A process of calculating the matrix A and the matrix B will be described in more detail.

A channel between the transmitting electronic device 110 and the receiving electronic device 130 is a noise channel. It is assumed that a distribution of the packets transmitted through the noise channel may be shown by a Markov chain. In addition, in the present disclosure, a HMM which is a more complicated construction, is selected, and the HMM is a model that is normalized from the Markov chain. A hidden Markov chain used in the present disclosure is regarded as a Markov process having a plurality of hidden state. All Markov chains may be completely characterized by an initial distribution $(p^0 = (p_1^0, p_2^0, \ldots, p_n^0))$ Here, n is the number of possible states. $P_i^0$ is the probability which is to be obtained from an i-th transition state, a transition probability matrix (or stochastic matrix) and a Markov matrix. $P_i^0$ may be defined by Equation 2 below.

$$P_n = \begin{pmatrix} p_{1,1} & p_{1,2} & \cdots & p_{1,n} \\ p_{21} & & p_{j,k} & p_{2,n} \\ \vdots & & \ddots & \vdots \\ p_{n,1} & p_{n,2} & \cdots & p_{n,n} \end{pmatrix}$$

Equation 2

In Equation 2, $P_{j,k}$ is a probability to be obtained from a j-th state to a k-th state.

In addition, the HMM may be completely characterized by the initial distribution, the transition probability matrix and a density of Markov matrix, and may be defined by Equation 3 below.

$$P'_n = \begin{pmatrix} p'_{1,1} & p'_{1,2} & \cdots & p'_{1,m} \\ p'_{21} & & p'_{j,k} & p'_{2,m} \\ \vdots & & \ddots & \vdots \\ p'_{n,1} & p'_{n,2} & \cdots & p'_{n,m} \end{pmatrix}$$

Equation 3

In Equation 3, $P'_{j,k}$ is a probability to be obtained in a k-th hidden state in which a j-th state is provided, and m is the number of hidden states. As described above, the channel model illustrated in FIG. 4 becomes a matrix for describing the hidden Markov matrix. Thus, Equation 2 and Equation 3 are defined by the matrix A and the matrix B from FIG. 4.

In operation 252, the receiving electronic device 130 may calculate a probability of $\alpha_t(i)$ using a forward-backward algorithm by Equation 4 below.

$$\alpha_t(i) = P\{d_1 d_2 \ldots d_t q_t = x_i | \lambda\}$$

Equation 4

In Equation 4, values of $D = d_1 d_2 \ldots d_T$ sequences observing sequences of 0 and 1, and $\lambda = (A, B, \pi)$ are parameters of the prototype channel model the same as the above-mentioned example.

Important factors of the present disclosure is estimating parameters of p, q and r. The estimation may be calculated based on information observing sequences of 0, which refers to a reception success and 1 which refers to a reception failure. Thus, t is the number of observations. Parameter $\lambda$ is defined as a set of different parameters (e.g., A, B and $\pi$) on each repetition in the Baum-Welth algorithm, or is defined by the HMM model having the above-mentioned parameters (i.e., A, B and $\pi$). Parameter ($q_1$) is a state of a process at a moment (t), and two types of states, for example, a) the random losses state and b) the burst losses state, are possible in the proposed model.

Therefore, Equation 4 may be a probability obtained from t times of observations, and may have the random losses state ($x_1$) or the burst losses state ($X_2$).

After the probability of $\alpha_t(i)$ is calculated by Equation 4, in operation 253, the receiving electronic device may calculate a probability of $\beta_t(i)$ using the forward-backward algorithm by Equation 5.

$$\beta_t(i) = P\{d_{t+1} d_{t+2} \ldots d_T | q_t = x_i, \lambda\}$$

Equation 5

In Equation 5, when a t-th state is $x_i$ and the channel model has the parameters of A, B and $\pi$, a (t+1)-th observation refers to a probability that is $d_{t+1}$, a (t+2)-th observation refers to a probability that is $d_{t+2}$, and a T-th observation refers to a probability that is $d_T$.

After the probability of $\beta_t(i)$ is calculated by Equation 5, in operation 254, the receiving electronic device 130 may calculate a probability of $\gamma_t(i)=P\{q_t=x_i|D,\lambda\}$ by Equation 6.

$$\gamma_t(i) = \frac{\alpha_t(i)\beta_t(i)}{\sum_{i=1}^{2}\alpha_t(i)\beta_t(i)} \qquad \text{Equation 6}$$

In Equation 6, $\gamma_t(i)$ refers to a probability of which the t-th state of the channel model is $x_i$ when whole sequences (i.e., $d_1, d_2, \ldots, d_t$) are observed and the channel model has the parameters of A, B and $\pi$.

After the probability of $\gamma_t(i)$ is calculated, in operation 255, the receiving electronic device 130 may calculate a probability of $\xi_t(i, j)=P\{q_t=x_i,q_{t+1}=x_j|D,\lambda\}$ by Equation 7.

$$\xi_t(i, j) = \frac{\alpha_t(i)a_{ij}b_{jd_{t+1}}\beta_{t+1}(j)}{\sum_{i=1}^{2}\sum_{j=1}^{2}\alpha_t(i)a_{ij}b_{jd_{t+1}}\beta_{t+1}(j)} \qquad \text{Equation 7}$$

In Equation 7, when a place where the packets are lost is known and the channel model has the parameters of A, B and $\pi$, $\xi_t(i, j)$ refers to a probability that the t-th state is $x_i$ and (t+1)-th state is $x_j$.

When all of the probabilities are calculated through the above-mentioned processes, in operation 256, the receiving electronic device 130 may recalculate the parameters of the prototype channel by Equation 8.

$$\hat{\pi}_i = \gamma_1(i), \qquad \text{Equation 8}$$

$$\hat{a}_{ij} = \frac{\sum_{t=1}^{T-1}\xi_t(i, j)}{\sum_{t=1}^{T-1}\gamma_t(i)},$$

$$\hat{b}_{ik} = \frac{\sum_{t:d_t=y_k}\gamma_t(i)}{\sum_{t=1}^{T}\gamma_t(i)}$$

In operation 257, the receiving electronic device 130 may check whether an estimation value that is recalculated by Equation 8 converges on a predetermined value. In order to check whether or not the estimation value is converged on the predetermined value, the calculations of operations 251 to 256 should be operated repetitively at least two or three times. According to the circumstances, the calculations of operations 251 to 256 may be operated repetitively at least dozens of times. That is, the calculations of operations 251 to 256 should be operated sufficiently until the recalculated values are converged on one value.

When the estimation value is initially calculated, since the receiving device 130 may not check whether the estimation value converges on the predetermined value, operation 251 may be performed after operation 257 is performed. In addition, a method of determining the estimation value converges on the predetermined value may include storing the value obtained by Equation 8 at least a predetermined number of times and setting a convergence on a representative specific value when a deviation or a difference between the stores values is smaller than a predetermined value. In addition, another method of determining the estimation value converged on the predetermined value may include adding a weighted value to several values obtained by Equation 8 and determining whether the estimation value converges on a specific value by operations.

When it is determined that the estimation value converges on one value as described above, in operation 258, the receiving electronic device 130 may determine estimation values of each parameter. For example, the converged values may obtain estimation values $\hat{\lambda}=(\hat{A},\hat{B},\hat{\pi})$ of the parameters of the prototype channel model. When the estimation value of the prototype channel model is obtained as described above, $\hat{p}=\hat{a}_{12}$, $\hat{q}=\hat{a}_{21}$, $\hat{r}=\hat{b}_{12}$ may be estimated values "p", "q" and "r," respectively.

A target of the algorithm according to the flowchart of FIG. 5 described above is increasing a probability obtained by Equation 9.

$$P\{D|\lambda\} = \sum_{Q} P\{D|Q,\lambda\}P\{Q|\lambda\} \qquad \text{Equation 9}$$

$$= \sum_{q_1 q_2 \cdots q_T} b_{q_1 d_1} b_{q_2 d_2} \cdots b_{q_T d_T} \pi_{q_1} a_{q_1 q_2} \cdots a_{q_{T-1} q_T}$$

In Equation 9, $Q=q_1 q_2 \ldots q_T$ is a sequence of states.

The method of the present disclosure provides a method for estimating unknown parameters, which are obtained using the MLE scheme. The estimation values obtained by the MLE scheme has following characteristics.

a. An asymptotic normality.

b. When there is an estimation value, the estimation value obtained by the MLE scheme is effective.

c. The value estimated by the MLE scheme has a consistence.

The above characteristic c indicates that the values estimated by the MLE scheme is considerably close to real values, when the number of observations is large enough.

Referring to FIG. 2 again, when the estimation of the parameter of the prototype channel is finished through the processes described above, in operation 260, the receiving electronic device 130 may determine an encoding parameter using the parameters calculated in operation 250. The determining of the encoding parameter may refer to determining an amount (or the size) of a parity, which is a remaining part added to data as described above.

In addition, the estimation values calculated through the above-mentioned processes may be constructed as a table having a predetermined range to be provided. Other methods may be used.

Whole operations described above are described again. In operation 210, the receiving electronic device 130 receives the packet through the noise channel, and converts the packet into the data. In operation 220, the receiving electronic device 130 may convert the data into information for applying to the statistical algorithm in correspondence to the reception success or failure of the data. In operation 230, the converted information is partitioned into the size which may be processed in the parameter estimation algorithm. In operation 240, the prototype channel, which is the simulation model of the noise channel is determined. In operation 250, the receiving electronic device 130 may estimate the parameters in correspondence to the prototype channel, using the statistical information generated in operation 220. In operation 260, the receiving electronic device 130 may determine the size of the parity field to be generated in the FEC encoder, using the estimated value.

The unknown parameters may be estimated in a predetermined channel model through the operations described above. Here, the predetermined channel model is the noise channel. The parameters of the FEC encoder may be more accurately defined in the noise channel, using the estimated parameters.

Second Embodiment

A Method of Estimating a Parameter of a Data Channel in a Dynamic Situation

The second embodiment is a case in which an Automatic Repeat reQuest (ARQ) of a corresponding channel is applied in addition to the above-mentioned first embodiment. For example, after receiving all feedback signals from a receiving electronic device 130, a parameter for a FEC encoding may be adjusted. Through this, when a noise channel is changed several times in a predetermined period (or a time interval), a FEC coding time may be remarkably reduced.

Figure 6:
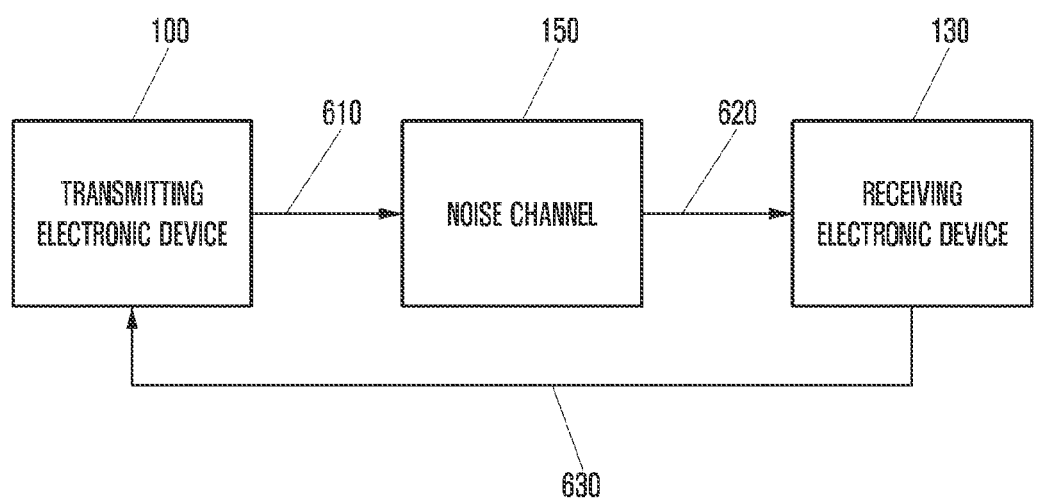
FIG. 6 is a conceptual construction diagram of a system for estimating a parameter of a data channel in a dynamic situation according to an embodiment of the present disclosure.

FIG. 6 is a conceptual construction diagram of a system for estimating a parameter of a data channel in a dynamic situation according to an embodiment of the present disclosure.

Referring to FIG. 6, a transmitting electronic device 100 may transmit data encoded through a predetermined FEC encoding scheme through a data channel. This is the same as reference numeral 610. At this time, the transmitting electronic device 100 may partition a stream of data to be transmitted into packages having predetermined sizes according to a SBA. The partitioned package is encoded by a predetermined FEC encoder and is transmitted through the data channel.

The data transmitted from the transmitting electronic device 100 may be transmitted through a noise channel 150. The noise channel 150 may be understood as a noisy channel that inserts the noise into the packets transmitted from the transmitting electronic device 100. Therefore, an error may occur in a portion or a whole of the packets. The data of which the error occur may be transmitted to a receiving electronic device 130 as shown to a reference numeral 620 of FIG. 6.

The receiving electronic device 130 may receive the packet, which is transmitted from the transmitting electronic device 100 through the noise channel 150, order the packets by a SDA, and restore original data using a parity field in a corrupt packet that is transmitted through the noise channel. This process may be understood by referring to operation 210 of FIG. 2 described above.

The receiving electronic device 130 may perform operation 200 of FIG. 2 as described above. That is, the receiving electronic device 130 may determine an amount (or the size) of the parity field by performing operations 210 to 260. The determined amount (or the size) of the parity field is transmitted to the transmitting electronic device 100 again as shown in reference numeral 630 of FIG. 6.

Therefore, the transmitting electronic device 100 may determine a parity size during the FEC encoding according to the amount (or the size) of the parity field which is provided from the receiving electronic device 130, constructing a packet using the determined size, and transmitting the packet.

As described above, when the channel is changed dynamically, in order to adaptably reflect the dynamic change of the channel, the receiving electronic device transmits the determined size of the parity field to the transmitting electronic device. Thus, the transmitting electronic device may perform the FEC encoding using a parameter provided from the receiving electronic device, that is, the size of the parity field which is optimized to the parity field.

Various aspects of the present disclosure can also be embodied as computer readable code on a non-transitory computer readable recording medium. A non-transitory computer readable recording medium is any data storage device that can store data which can be thereafter read by a computer system. Examples of the non-transitory computer readable recording medium include Read-Only Memory (ROM), Random-Access Memory (RAM), CD-ROMs, magnetic tapes, floppy disks, and optical data storage devices. The non-transitory computer readable recording medium can also be distributed over network coupled computer systems so that the computer readable code is stored and executed in a distributed fashion. Also, functional programs, code, and code segments for accomplishing the present disclosure can be easily construed by programmers skilled in the art to which the present disclosure pertains.

At this point it should be noted that various embodiments of the present disclosure as described above typically involve the processing of input data and the generation of output data to some extent. This input data processing and output data generation may be implemented in hardware or software in combination with hardware. For example, specific electronic components may be employed in a mobile device or similar or related circuitry for implementing the functions associated with the various embodiments of the present disclosure as described above. Alternatively, one or more processors operating in accordance with stored instructions may implement the functions associated with the various embodiments of the present disclosure as described above. If such is the case, it is within the scope of the present disclosure that such instructions may be stored on one or more non-transitory processor readable mediums. Examples of the processor readable mediums include Read-Only Memory (ROM), Random-Access Memory (RAM), CD-ROMs, magnetic tapes, floppy disks, and optical data storage devices. Also, functional computer programs, instructions, and instruction segments for accomplishing the present disclosure can be easily construed by programmers skilled in the art to which the present disclosure pertains.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of estimating a parameter of a data channel model in a communication system, the method comprising:
    decoding a packet received through a noise channel, the noise channel being a channel where a noise is inserted into some packets;
    converting the packet into data indicating one of a success and a failure of a reception of the packet, success of the reception being when the packet is received without the noise or when the noise in the packet is able to be corrected;
    configuring a prototype channel having at least one unknown parameter, the prototype channel being a simulation of the first channel;

estimating the at least one unknown parameter using the data indicating the one of the success and the failure of the reception of the packet; and determining a size of a parity field of a forward error correction (FEC) symbol, using the estimated at least one unknown parameter.

2. The method of claim 1, wherein the received packet is a packet encoded by a determined FEC symbol.

3. The method of claim 1, wherein the prototype channel executes a Gilbert model and does not allow burst losses.

4. The method of claim 1,
wherein the data indicating the one of the success and the failure of the reception includes a data stream, and
wherein the method further comprises partitioning the data into a determined unit of a sub group.

5. The method of claim 4, wherein the sub group includes a plurality of data that is possible to be processed in an algorithm for estimating the at least one unknown parameter.

6. The method of claim 1, wherein the estimated at least one unknown parameter is stored as a table having a determined range.

7. The method of claim 1, further comprising:
transmitting the at least one unknown estimated parameter to a transmitting side.

8. A non-transitory computer-readable storage medium storing instructions that, when executed, cause at least one processor to perform the method of claim 1.

9. A system for estimating a parameter of a data channel model in a communication system, the system comprising:
a transmitting electronic device configured to:
construct a packet in a determined error correction encoding scheme, and
transmit the packet using a channel where noise is inserted into some packets; and
a receiving electronic device configured to:
decode the packet received from the transmitting electronic device to convert the packet into data indicating one of a success and a failure of the reception of the packet, success of the reception being when the packet is received without the noise or when the noise in the packet is able to be corrected,
configure a prototype channel having at least one unknown parameter,
estimate the at least one unknown parameter using the data indicating the success or failure of the reception of the packet, and
determine a size of a parity field of a forward error correction (FEC) symbol using the estimated at least one unknown parameter.

10. The system of claim 9, wherein the prototype channel executes a Gilbert model and does not allow burst losses.

11. The system of claim 9, wherein the receiving electronic device is further configured to construct the data indicating the one of the success and the failure of the reception as a data stream, and partitions the data into a determined unit of a sub group.

12. The system of claim 11, wherein the sub group includes a plurality of data that is possible to be processed in an algorithm for estimating the at least one unknown parameter.

13. The system of claim 9, wherein the estimated at least one unknown parameter is stored as a table having a determined range.

14. The system of claim 9, wherein the receiving electronic device is further configured to transmit the estimated at least one unknown parameter to a transmitting side.

15. The system of claim 14, wherein the transmitting electronic device is further configured to redetermine the size of a parity field, using the estimated at least one unknown parameter.

* * * * *